(12) United States Patent
Liang et al.

(10) Patent No.: US 7,508,701 B1
(45) Date of Patent: Mar. 24, 2009

(54) NEGATIVE DIFFERENTIAL RESISTANCE DEVICES AND APPROACHES THEREFOR

(75) Inventors: Yue Liang, Beacon, NY (US); Kailash Gopalakrishnan, San Jose, CA (US); Peter Griffin, Woodside, CA (US); James D. Plummer, Portola Valley, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 42 days.

(21) Appl. No.: 11/605,533

(22) Filed: Nov. 29, 2006

(51) Int. Cl.
*G11C 11/00* (2006.01)
*G11C 5/06* (2006.01)
*H01L 29/74* (2006.01)

(52) U.S. Cl. .................. 365/159; 365/71; 257/133

(58) Field of Classification Search ......... 365/159, 365/71
See application file for complete search history.

(56) References Cited

U.S. PATENT DOCUMENTS

| | | | |
|---|---|---|---|
| 7,050,327 B2 * | 5/2006 | Campbell | ............ 365/159 |
| 2003/0026126 A1 * | 2/2003 | Uemura | ............ 365/159 |
| 2004/0008535 A1 * | 1/2004 | King | ............ 365/159 |
| 2004/0142533 A1 * | 7/2004 | King et al. | ............ 438/289 |
| 2005/0128803 A1 * | 6/2005 | Luk et al. | ............ 365/175 |

OTHER PUBLICATIONS

Liang, Yue, Gopalakrishnan, Kailash, Griffin Peter B., Plummer, James D., "From DRAM to SRAM with Novel SiGe-based Negative Differential Resistance (NDR) Device," Electron Devices Meeting, 2005, IEDM Technical Digest,. IEEE International, Dec. 5-7, 2005, pp. 959-962.

* cited by examiner

*Primary Examiner*—Ly D Pham
(74) *Attorney, Agent, or Firm*—Crawford Maunu PLLC

(57) ABSTRACT

Negative differential resistance devices are implemented to facilitate current flow under different operating conditions. According to an example embodiment of the present invention, an NDR device is arranged for selective passage of current through relatively high tunneling efficiency regions and relatively low tunneling efficiency regions. In some applications, a gate is used to accumulate carriers to facilitate the passage of current that is predominantly one of tunneling current and generation current, respectively, by controlling the passage of current through a relatively high tunneling efficiency region and a relatively low tunneling efficiency region. In some implementations, the NDR device is arranged to mitigate leakage in a storage device using a two-terminal connection.

21 Claims, 7 Drawing Sheets

NEGATIVE DIFFERENTIAL RESISTANCE DEVICES AND APPROACHES THEREFOR

FIELD OF THE INVENTION

The present invention relates generally to electronic devices, and more particularly to negative differential resistance devices and their implementations.

BACKGROUND

With the rapid growth of the semiconductor industry, high-density semiconductor memory devices have already reached the gigabit scale, led by the progressive development of dynamic random access memory (DRAM) technology. Meanwhile, the increasing speed gap between the logic and DRAM technologies has led to complex memory hierarchies and the need for high speed on-chip DRAMS.

One common DRAM memory cell involves a single access transistor and a capacitor in a one-transistor, one-capacitor (1T1C) arrangement, where information is stored in the form of charge on the capacitor. Although the DRAM cell has generally exhibited a smaller cell size relative to other cells, ranging between $4F^2$ and $8F^2$, where F is the minimum feature size, it requires periodic refreshing because of the leakage of charge on the capacitor. As technology scales, the transistor leakage current keeps increasing, which only exacerbates the data retention problem. In this regard, the threshold voltage of the access transistor is generally kept at a high level, since reducing the threshold voltage results in an exponential increase in subthreshold leakage and, therefore, much smaller data retention time. With these challenges, the continued scaling of DRAM technology to much higher densities and higher performances presents significant technological challenges.

Static RAM (SRAM) does not require refreshing and is generally faster than DRAM (e.g., approaching a nanosecond or shorter for access time, relative to tens of nanoseconds for access to DRAM cells). However, SRAM cells have generally been significantly more complex than DRAM cells, and in some applications requiring either four n-channel MOSFETs and two p-channel MOSFETs, or four n-channel MOSFETs and two polysilicon load resistors. These complex SRAM arrangements have generally resulted in significantly larger cell size (typically greater than $100F^2$), relative to DRAM cell sizes.

Negative differential resistance (NDR) devices have been proposed for compact static memory applications, where NDR devices are added to a 1T1C DRAM cell. Generally, if the current of the NDR element can compensate for the leakage of the memory cell, the information stored in the capacitor will not be lost and therefore a static high-density memory cell can be achieved. However, most SRAM applications involving NDR devices have suffered from a variety of undesirable operational characteristics. In addition, the manufacture of such devices has often required processes that are not readily implemented with common CMOS-type fabrication, require additional steps and/or cost.

These and other characteristics have been challenging to the implementation of negative differential resistance devices in memory and various other applications.

SUMMARY

The present invention is directed to overcoming the above-mentioned challenges and others related to the types of applications discussed above and in other applications. These and other aspects of the present invention are exemplified in a number of illustrated implementations and applications, some of which are shown in the figures and characterized in the claims section that follows.

According to an example embodiment of the present invention, an NDR device includes an electrical-gradient region and a tunneling-gradient region. The tunneling-gradient region has respective regions for relatively-high tunneling efficiency and relatively-low tunneling efficiency, to facilitate conduction through the electrical-gradient region via the relatively-high tunneling efficiency region in a first stage, and to facilitate conduction through the relatively-low tunneling efficiency region in another stage. Relative to a current plot for the NDR device depicting peak-to-valley current ratio (PVCR), the tunneling-gradient region facilitates conduction corresponding to a peak region of the plot at an initial stage, and facilitates conduction relative to a valley region of the plot at another later stage.

According to another example embodiment of the present invention, a memory device includes a capacitive data-storage circuit, an access circuit and an NDR device to compensate for cell leakage. The access circuit provides access between the capacitive data-storage circuit and a circuit node while exhibiting cell leakage. The cell is subject to leakage via one or more of the access circuit (e.g., a transistor), junction leakage or dielectric leakage. The NDR device is connected to the access circuit in parallel with the capacitive data-storage circuit, and includes an electrical-gradient region and a tunneling-gradient region. The tunneling-gradient region includes respective regions for relatively-high tunneling efficiency and relatively-low tunneling efficiency, to facilitate relatively high conduction through the electrical-gradient region in an initial PVCR stage (e.g., peak region) and, in another PVCR stage (e.g., valley region), to mitigate high conduction (facilitating relatively low conduction) through the electrical-gradient region. The current of the NDR device can be used to compensate for the leakage.

The above summary is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention that follows in connection with the accompanying drawings in which.

Figure 1:
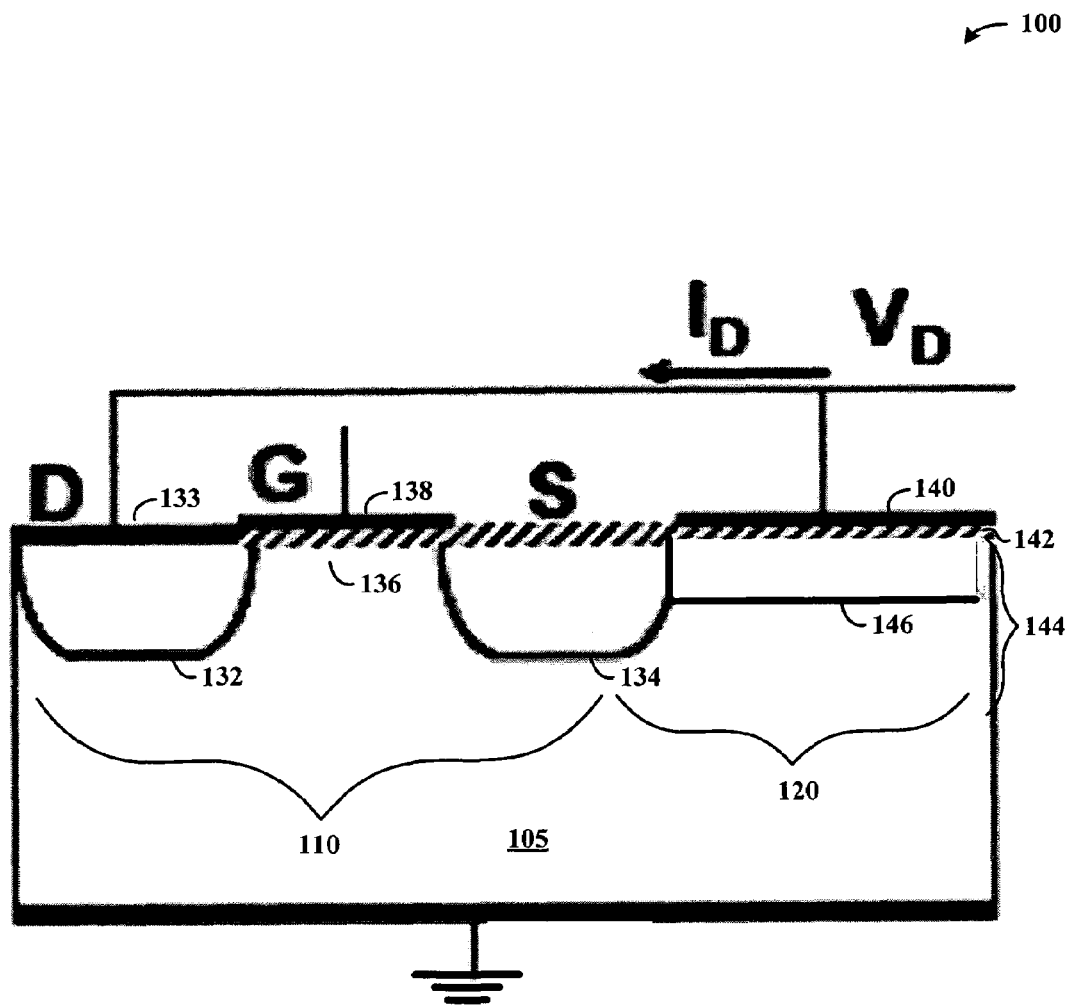
FIG. 1 shows a gated NDR arrangement, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention is believed to be applicable to a variety of different types of devices and processes, and the invention has been found to be particularly suited for the implementation of negative differential resistance devices to mitigate leakage effects such as data retention problems by compensating for leakage. While the present invention is not necessarily limited to such applications, various aspects of the invention may be appreciated through a discussion of examples using this context.

According to an example embodiment of the present invention, a two-layer structure is used to separate the sources or mechanisms of peak and valley currents for an NDR device electrically arranged in parallel to a storage device. Current from the NDR device is used to compensate for leakage from the storage device. Using this approach, the peak current for the NDR device can be enhanced and the valley current suppressed individually, using different approaches as appropriate.

In some implementations, the two layers have different bandgaps, with a low bandgap material exhibiting relatively-high tunneling efficiency and high generation rate as an upper layer, and a large bandgap material with relatively-low tunneling efficiency and low generation rate as a lower layer. A gate-type structure is arranged to capacitively couple to the two-layer structure, and a source-type structure is arranged adjacent to the two layers to provide the current that compensate for leakage in a parallel storage device.

In different example embodiments, leakage is addressed by compensation as a function of any of various device characteristics. In one implementation involving a memory application, leakage compensation is provided to address cell leakage such as subthreshold leakage and junction leakage of an access circuit (e.g., a transistor) for a memory cell.

According to another example embodiment of the present invention, a two-terminal NDR device is electrically arranged in parallel with a storage device to compensate for leakage from the storage device and to mitigate the loss of any stored charge. The NDR device includes a gate over a tunneling-gradient (e.g., channel-type) region that is adjacent to an active region (or an arrangement including an active region). A relatively low-bandgap material such as Germanium, Silicon-Germanium or Indium Arsenide is located below the gate and at an upper surface area of the tunneling-gradient region.

When the gate is negatively biased, the lateral electric field between the active region and the accumulated surface is high. Band-to-band tunneling (BTBT) and trap-assisted tunneling (TAT) currents dominate under this condition, and the active region current is at its highest level. When the surface under the gate is depleted, surface generation current starts to play a role. The low-bandgap material facilitates all three of the preceding current components.

Once the surface under the gate is inverted, the three current components drop dramatically, and the valley current mainly comes from generation within the depletion region of a p-n junction and field induced junction, which occurs mostly in the tunneling-gradient region below the low-bandgap material (e.g., as the low-bandgap material is located at the upper surface of the tunneling-gradient region). The current at the active region therefore exhibits current drop with respect to the gate voltage.

In some embodiments, a contact to the active region is indirectly coupled with the gate to facilitate NDR behavior via the current generated within the accumulated region. The indirect nature of this coupling facilitates the inversion of the surface under the gate to reduce and/or cut off tunneling current and surface generation current. In some applications, the indirect coupling is affected by structure forming part of one or both of the channel region and the active region and/or between the channel region and the active region. The gate and active region are thus electrically coupled to a common terminal that is also electrically coupled to the storage device, with the storage device and the NDR device also coupled to ground.

In connection with the above example embodiments, it has been discovered that devices implementing a Silicon-Germanium material in an upper portion of a channel region exhibit robust NDR characteristics with high current density and a relatively large peak-to-valley current ratio (PVCR) (e.g., a ratio as high as or higher than 295 at room temperature (e.g., 21-23° C.), and at about 1113 at about −65° C.). Direct measurements of the source potential also show that the source potential initially follows the drain, and then is pinned at higher drain biases. It has also been discovered that trap-assisted tunneling (TAT) and band-to-band tunneling (BTBT) current components dominate the peak current, whereas the valley current is largely due to bulk generation currents. In this regard, NDR devices exhibiting these characteristics are implemented with storage (memory) cells in a manner that facilitates rapid memory access while mitigating charge leakage effects. Moreover, NDR devices in accordance with various example embodiments are readily scaled smaller, as the peak current is substantially tunneling current and does not scale with channel length, and as the valley current is substantially generation current (within the depletion region of a p-n junction at the channel) which decreases with decreasing channel length.

Turning to the figures, FIG. 1 shows a gated NDR arrangement 100, according to another example embodiment of the present invention. The NDR arrangement 100 includes a control transistor 110 and a gated diode 120 in and on a substrate 105. The control transistor 110 and gated diode 120 are electrically coupled such that the gate voltage at the gated diode is common to a node from which current passes from the NDR arrangement 100 (i.e., realizing a two-terminal device readily implemented with a storage device).

The control transistor 110 includes a drain 132 and source 134 separated by a channel region 136. A dielectric layer 142 is over the channel 136, and a gate 138 is over the dielectric layer. In response to an applied voltage, the gate 138 biases the channel 136, via the dielectric layer 142, to control the channel for electrically coupling the drain 132 and source 134.

The gated diode 120 includes a gate 140 over a channel region 144 (e.g., a tunneling-gradient region) that is adjacent to the source 134, shared with the control transistor 110. As with the control transistor's gate 138, the diode's gate 140 is separated from the channel region 144 by the dielectric layer 142. While shown extending over the source 134 in a continuous layer between the control transistor's gate 138 and the diode's gate 140, the dielectric layer 142 is selectively located in separate portions at each gate, and, in some applications, is formed in separate steps. The channel region 144 includes an upper region 146 having a relatively low bandgap (e.g., exhibited by a Silicon-Germanium material).

Figure 2A:
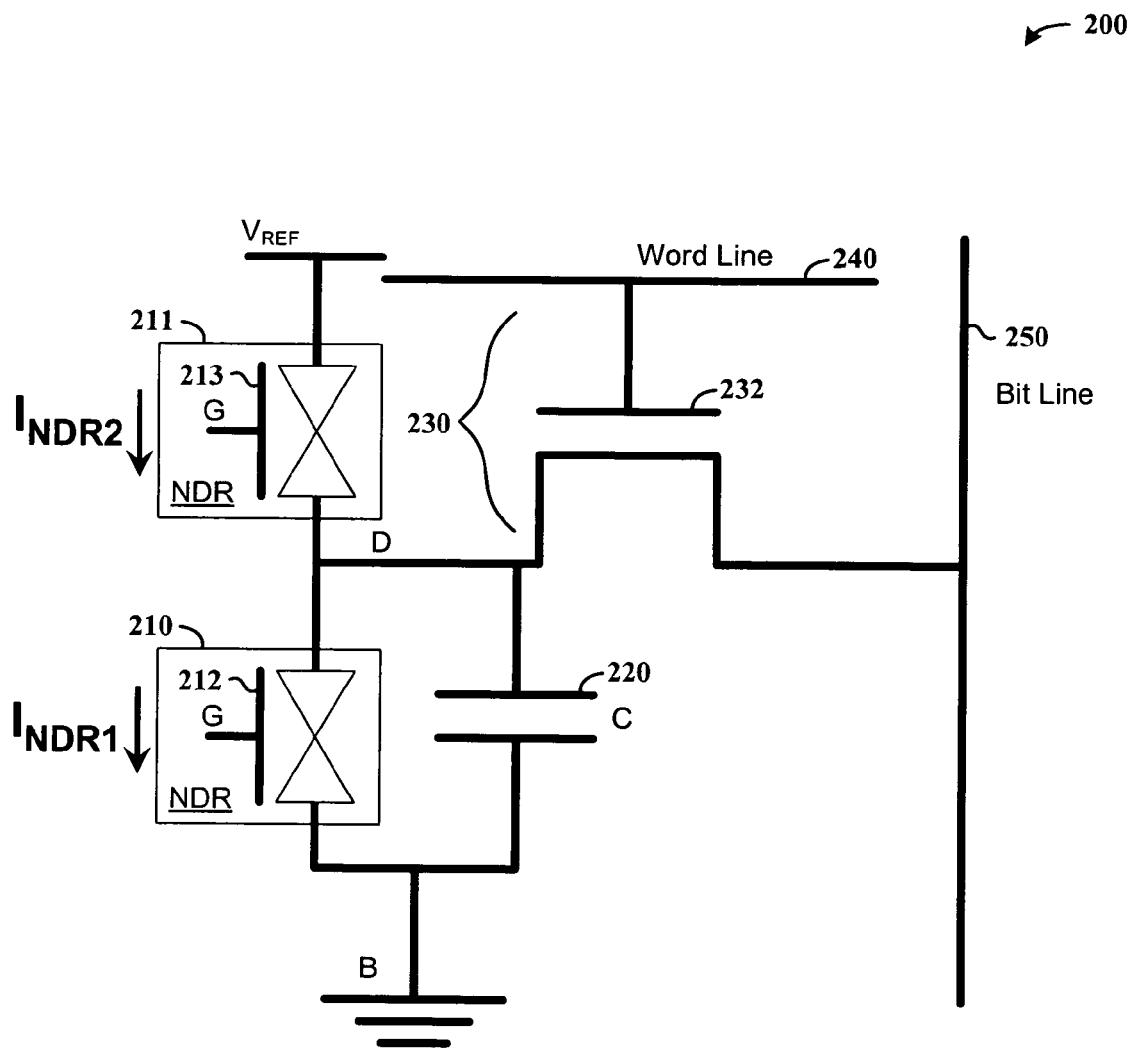
FIG. 2A shows a memory cell with an NDR arrangement, according to another example embodiment of the present invention.

A contact 133 at the drain 132 is electrically coupled with the gate 140 of the gated diode 120, such that current is pulled out via the same voltage-regulated node to which voltage is applied to the gate 140 (and, correspondingly, to a parallel storage device as shown, for example, in FIG. 2A). The control transistor gate 138 is kept at a relatively constant positive bias, such that initially when all the other terminals are grounded, the control transistor 110 is on. As the drain voltage at the drain 132 is increased, the potential of the source 134 follows the drain potential and the current increases initially. This increase eventually puts the control transistor 110 in the subthreshold regime, which clamps the potential of the source 134. Since the gate 140 of the gated diode 120 is connected to the drain 132, the surface under the gate 140 goes from accumulation to inversion and the diode current drops as significantly as the transistor's current. In this regard, the NDR device 100 behaves as a two-terminal NDR device, with the NDR behavior controlled by the gate 138 of the control transistor 110.

The gated NDR arrangement 100 is implemented with a variety of substrates, dopants, dopant concentrations, dielectrics and low-bandgap materials in connection with various example embodiments, to suit certain NDR behavior and/or in accordance with available materials. Generally, these materials are used to form an electrical-gradient region where electrical-charge characteristics change between (thereby delineating) regions in the semiconductive material such as between the source 134 and the channel region 144. In some applications, the substrate 105 is a p-type silicon substrate, with the source 134 and drain 132 doped with an n-type dopant. In other applications, the substrate 105 is an n-type silicon substrate, with the source 134 and drain 132 doped with a p-type dopant. Relative to the low-bandgap materials, for some applications, the upper portion 146 of the diode channel region 144 is an in-situ doped relaxed Silicon-Germanium (e.g., $Si_{0.4}Ge_{0.6}$) film. For certain applications with the dielectric layer 142, a Silicon cap layer is epitaxially-grown over the channel regions 144 and patterned using a low temperature oxide. The Silicon cap layer is oxidized to form a gate oxide (dielectric) layer 142 as shown in FIG. 1. Other fabrication steps for the source 134, drain 132, gates 138 and 140, and other aspects of the device 100, as well as other devices shown and described herein, are implemented using one or more CMOS-type processes (see, e.g., Plummer et al., *Silicon VLSI Technology*, Prentice Hall; United States Ed edition (Jul. 14, 2000), which is fully incorporated herein by reference).

In some implementations, the low-bandgap material at the upper portion 146 of the gated diode's channel region 144 includes strained Silicon-Germanium material. The strained nature of the low-bandgap material facilitates the suppression of trap-assisted tunneling in the gated diode 120. With this approach, the gated NDR arrangement 100 is readily scaled smaller while mitigating undesirable tunneling current effects and providing a desirable peak and valley current useful in various applications including, for example, logic and memory applications.

FIG. 2A shows a memory cell 200 having an NDR arrangement 210 that compensates for leakage current, according to another example embodiment of the present invention. The memory cell 200 includes a storage capacitor 220 arranged in parallel with the NDR arrangement 210, and an access transistor 230. The access transistor 230 controls storage of data at the capacitor 220, as well as access to data that is stored at the capacitor. Generally, a word line 240 applies a voltage to the gate 232, and a bit line 250 is coupled to the access transistor 230 for reading and writing data from/to the storage capacitor 220.

The NDR arrangement 210 is a two-terminal NDR device exhibiting current behavior characteristics that facilitate the data retention (charge stored at the capacitor 220). The NDR arrangement optionally includes a gate 212 that is arranged to bias a control transistor or other appropriate portion of the NDR arrangement. For example, in some applications, the NDR arrangement 210 includes the gated NDR arrangement 100 of FIG. 1. In such applications, the gate 212 operates in accordance with the gate 138 in FIG. 1 to control current in the channel region 136 of the control transistor 110, thereby controlling the NDR arrangement 210 for different peak voltage and current magnitude to compensate leakage current associated with the access transistor 230 as represented by current $I_{NDR1}$. In an alternative embodiment where only NDR 210 is used (with NDR 211 removed), the leakage current is from the bit line 250. In this regard, a variety of NDR arrangements are implemented with the memory cell 200, depending upon the application, with some NDR arrangements implementing a gate 212 as shown. FIGS. 3-6 show various NDR arrangements that may be implemented in connection with the memory cell 200.

In certain embodiments, a memory cell similar to the memory cell 200 shown in FIG. 2A is implemented with one or more other types of storage devices, with a storage device that is different than the capacitor 220 in place of the capacitor, or with other circuitry. In these embodiments, the NDR arrangement 210 is used to compensate for leakage current in a similar manner. In addition, as is common with memory applications, a multitude of such memory cells may be implemented in an array or other arrangement, involving similar NDR arrangements that compensate for leakage current for the memory cells.

In another example embodiment of the present invention, the memory cell 200 includes a second NDR device 211, coupled to compensate for current leakage in the memory cell in connection with the NDR device 210 for different memory storage states. Generally, the NDR device 210 provides current to makeup for leakage current at storage of a bit "0" with the capacitor 220 via $I_{NDR1}$, and the NDR device 211 provides current to make up for charge loss at storage of a bit "1" at the capacitor via $I_{NDR}$. Generally, the NDR device 211 (as with device 210) may be implemented using one or more of the devices described herein and/or shown in connection with one or more of FIGS. 1, 3, 4, 5 and 6.

Figure 2B:
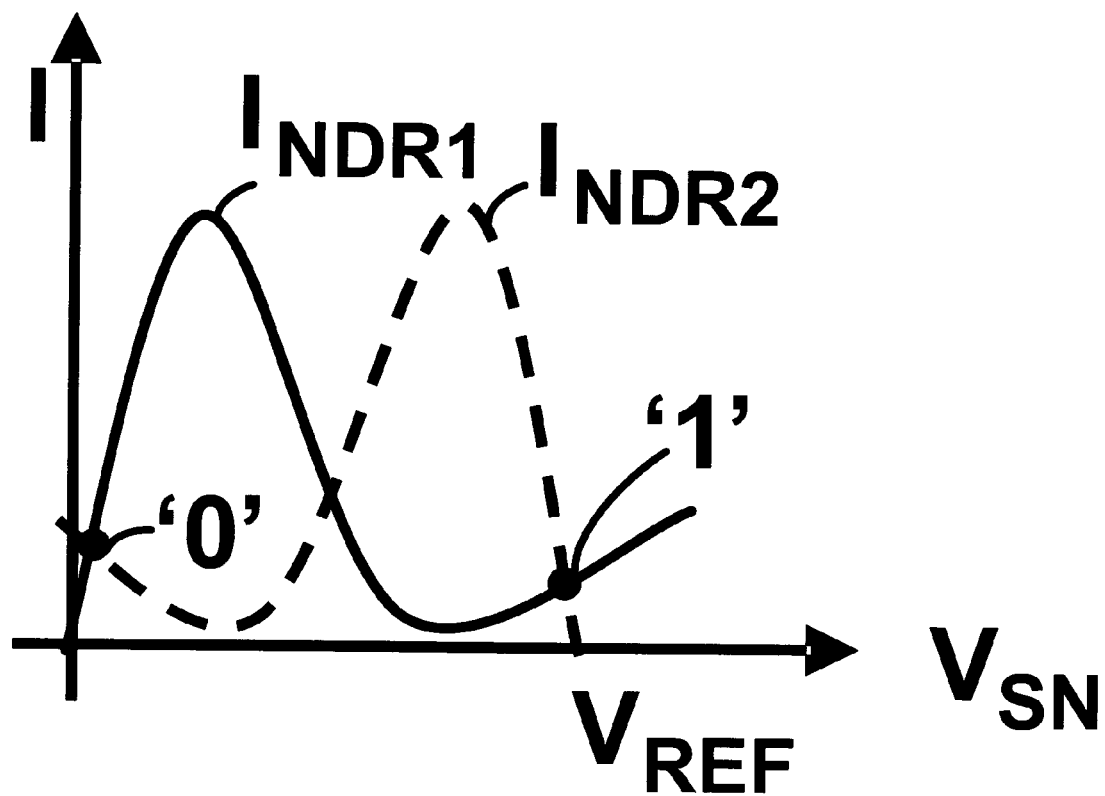
FIG. 2B shows a plot for an approach to the operation of a memory cell with two NDR devices, according to another example embodiment of the present invention.

FIG. 2B shows a plot for an approach to the operation of the memory cell 200 with both of the NDR devices 210 and 220, according to another example embodiment of the present invention. Shown is the current through the NDR device 210 ($I_{NDR1}$) and through the NDR device 211 ($I_{NDR2}$, dashed) respectively implemented to compensate for leakage current under conditions for the storage of a bit "0" and a bit "1."

Figure 3:
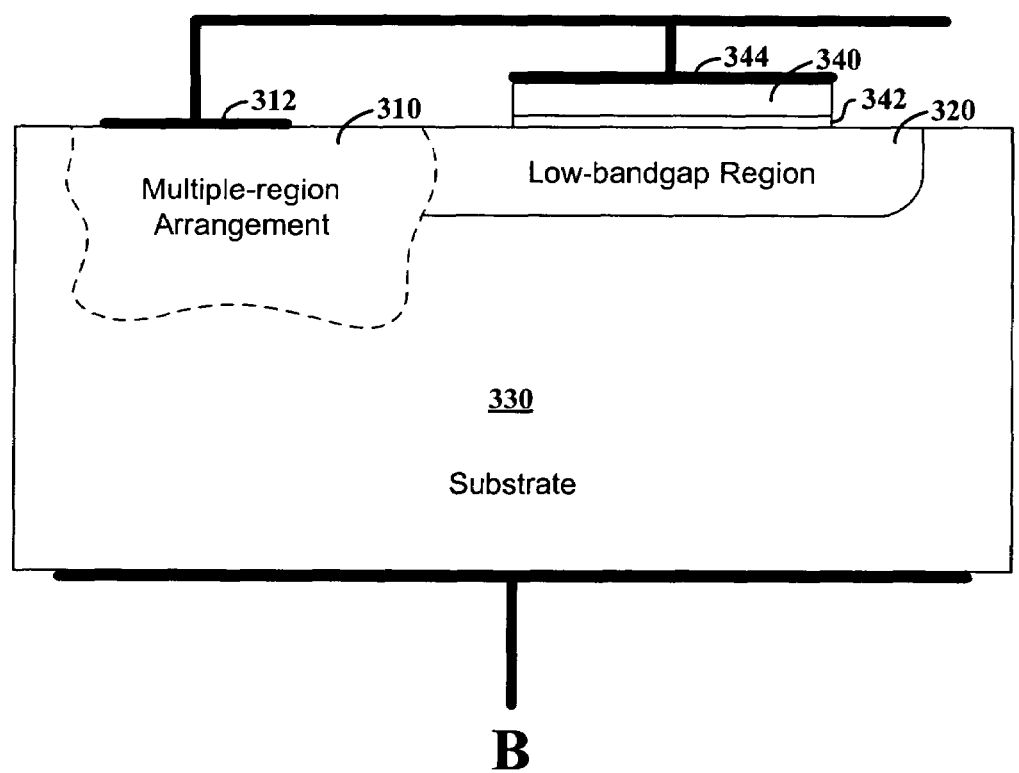
FIG. 3 shows a two-terminal NDR device for mitigating leakage effects in a storage device, according to another example embodiment of the present invention.

Another example of a two-terminal NDR device 300, in accordance with the present invention, is depicted in the embodiment of FIG. 3. Emphasizing important operational aspects of this device, FIG. 3 does not illustrate certain structure shown in FIG. 1 or in FIGS. 4-6. More specifically, FIG. 3 shows the NDR device 300 including multiple-region arrangement 310 which includes a source (not shown in FIG. 3) and including a low-bandgap region 320 in a semiconductor substrate 330. As shown, the multiple-region arrangement 310 is illustrated by dashed lines as emphasizing its general representation of various acceptable shapes as may be applicable to suit particular applications. In more specific embodiments, for example, arrangement 310 is implemented as 110 (FIG. 1), 402 (FIG. 4), 502 (FIG. 5), and 602 (FIG. 6).

Generally, the multiple-region arrangement 310 includes devices and/or characteristics to facilitate the inversion at the low-bandgap region 320 such that the coupling between the gate and the source is indirect. While various examples of such indirect coupling are shown in connection with the other figures and described herein, various example embodiments are directed to implementation of the multiple-region arrangement 310 to facilitate operation of the NDR device 300 in different manners.

The multiple-region arrangement 310 acts as a source and is coupled to a contact 312 that is common to a gate contact 344 for the low-bandgap region 320. The low-bandgap region includes a material exhibiting a relatively low bandgap, such as a Silicon-Germanium material, and the substrate includes a semiconducting material such as a p-doped Silicon material. The gate contact 344 is arranged to apply a voltage to a gate electrode 340, which biases the low-bandgap region 320 by way of a gate dielectric 342. In this regard, the two-terminal aspect of the NDR device 300 involves a first terminal that is electrically common to the active region contact 312 and the gate contact 344, and a second terminal (B) coupled to the substrate 330.

The multiple-region arrangement 310 (i.e., as a source) includes one or more materials and/or dopant concentrations to supply current at the active region contact 312 in a manner commensurate with one or more of the approaches described above. In one implementation, a control transistor is implemented with the multiple-region arrangement 310 in a manner similar to the approach shown in FIG. 1. Other implementations involve approaches similar to those shown in and described in connection with FIGS. 4-6. With these approaches, the NDR devices based on device 300 can exhibit a desirably high peak-to-valley current ratio (PVCR), which makes the device amenable to two-terminal application in parallel with a storage device. Generally, the multiple-region arrangement 310 is arranged as discussed above or otherwise to facilitate the inversion of the low-bandgap region 320 upon application of a bias via the gate contact 344. This inversion facilitates the corresponding cut-off of tunneling current and surface generation current in the device 300. The source potential (at the active region contact 312) rises slowly enough compared to the voltage applied at the gate contact 344 such that the surface of the low-bandgap region 320 (near the dielectric 342) can be inverted, facilitating NDR behavior under such bias schemes. (In this regard, one terminal is used to control both the bias at the gate electrode 340 and the source (active region contact 312) appropriately.

Using the above approaches, the source current facilitated by the NDR device 300 is coupled to maintain a charge at a storage device. For instance, the NDR device 300 can be implemented as one or both of the NDR arrangements 210 and 211 in FIG. 2A to offset leakage current to facilitate the maintenance of a charge at a storage device (e.g., capacitor 220).

In various example embodiments, characteristics of the low-bandgap region 320 and the multiple-region arrangement 310 are tailored to the particular application, such as to provide a relatively high PVCR. For instance, doping concentrations and material properties can be selected to enhance certain NDR attributes (behavior relative, for example, to a high PVCR equal or larger than about 300) by increasing the electric field, boosting tunneling current (BTBT and/or trap-assisted tunneling), suppressing the valley/excess current, and combinations thereof. Such selections and/or modifications of described embodiments may involve, for example, using material having a lower bandgap than the Silicon-Germanium examples described herein, using a material with smaller tunneling effective mass, increasing the doping concentration and making the junction (p-n) more abrupt, and using a direct bandgap material with higher tunneling efficiency, such as III-V materials. In one application, strained material is used with a channel region under the gate to minimize trap-assisted tunneling and reduce valley current.

Other material selections replacing and/or modifying materials implemented with embodiments described herein involve, for example, the use of a substrate 330 having material with relatively wider (or smaller) bandgap, heavier (or lighter) tunneling effective mass, or lighter (or heavier) doping concentration relative to the p-doped Silicon substrate example described above. In some applications, the substrate 330 includes an insulating material.

Figure 4:
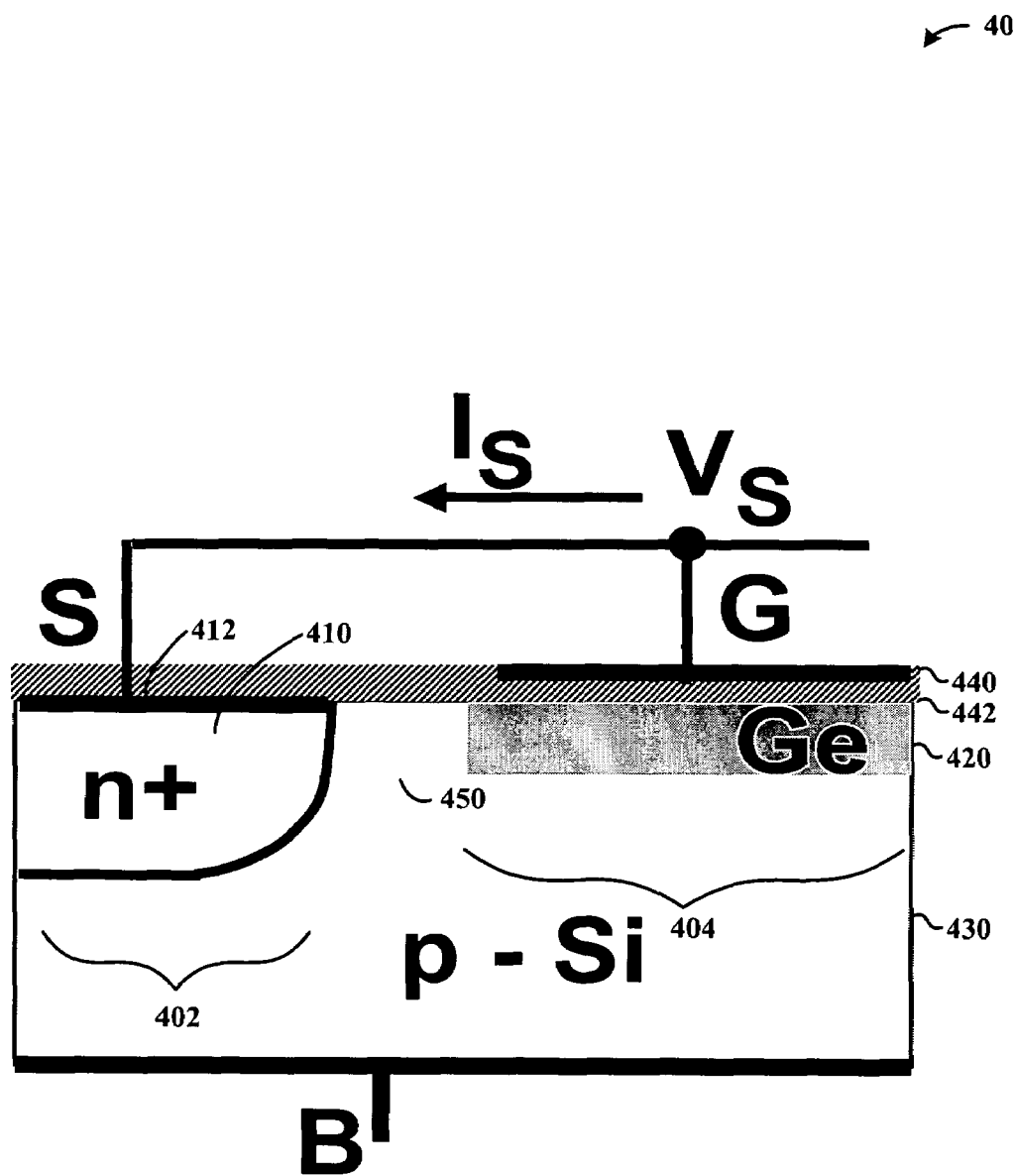
FIG. 4 shows a two-terminal NDR arrangement with a spacer, according to another example embodiment of the present invention.
Figure 5:
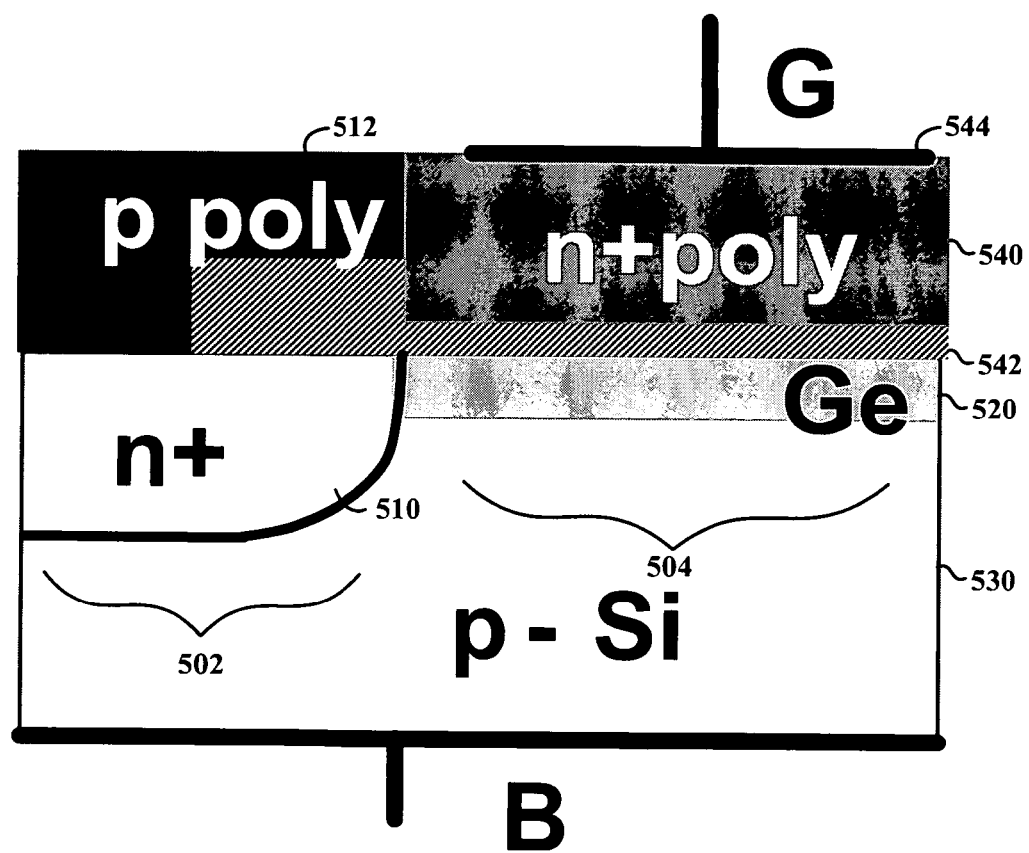
FIG. 5 shows a two-terminal NDR arrangement with a bridge, according to another example embodiment of the present invention.
Figure 6:
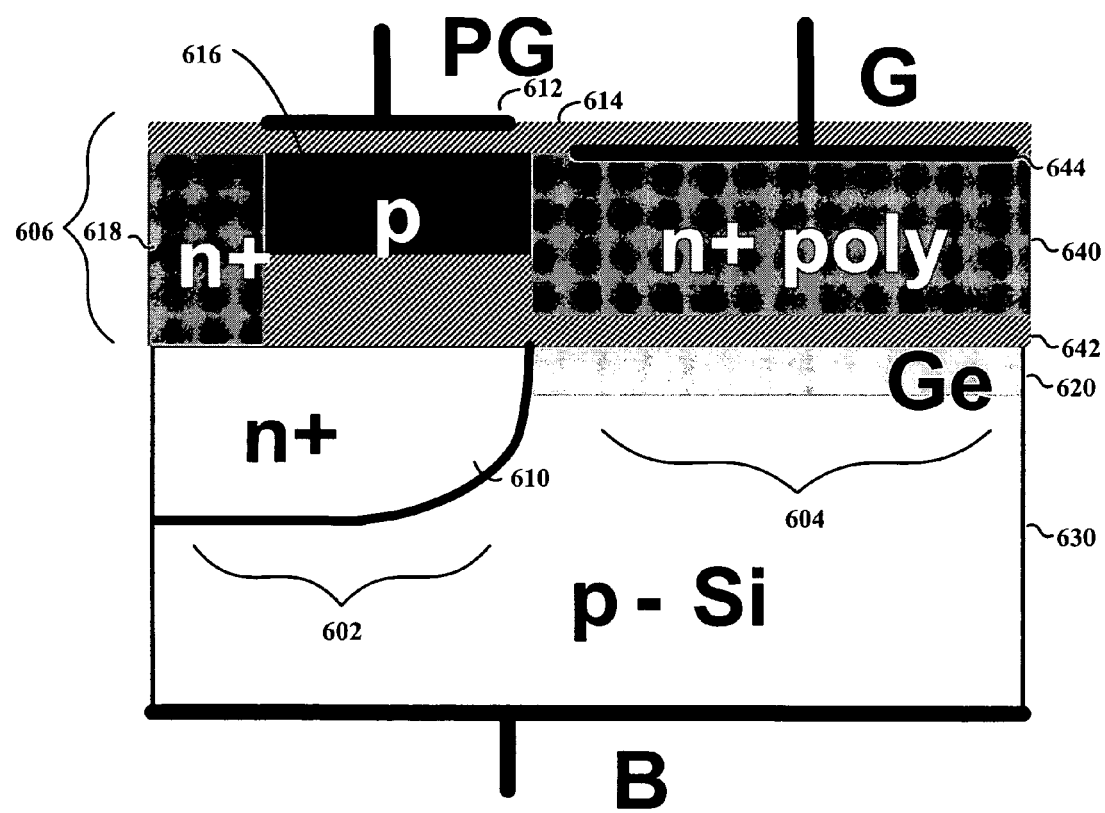
FIG. 6 shows a two-terminal NDR arrangement with a thin-film-transistor, according to another example embodiment of the present invention.

In another example embodiment of the present invention, the work function of the gate (e.g., a diode gate 140 of FIG. 1, gate 344 of FIG. 3, or as shown in FIGS. 4-6) is tuned to facilitate certain current behavior of the NDR device. Tuning, in this context, generally involves setting the gate material type and arrangement to achieve a particular work function that is relative to the underlying channel region. This approach may be implemented, for example, with one or more of the embodiments shown in the figures and discussed above. For instance, in one implementation, the work function is set so that the current of the corresponding two-terminal NDR device drops in the region where the peak current is band-to-band tunneling (BTBT) current and the valley current is generation current.

FIG. 4 shows a two-terminal NDR arrangement 400 with a spacer 450, according to another example embodiment of the present invention. The arrangement 400 includes a source region 402 and a gated region 404, each coupled to a common input (i.e., represented at node $V_s$) respectively by way of contact 412 and gate 440.

The source region 402 includes an n+ doped region 410 (e.g., a source) coupled to the contact 412, forming a p-n junction with a p-doped silicon substrate region 430. The gate region 404 includes a relatively low-bandgap region 420, shown implemented with Germanium, which is separated from the gate 440 by a dielectric layer 442. The p-doped substrate region 430 forms a relatively higher bandgap region adjacent to the low-bandgap region 420. The n+ region 410 is coupled to the low-bandgap region 420 by the spacer 450.

In one implementation, the spacer 450 is a dielectric spacer that serves as a large resistor to mitigate the influence of the source node (412) upon the gated region 404, which tends to prevent the channel from forming.

FIG. 5 shows a two-terminal NDR arrangement 500 with a source region 502 bridged with a gated region 504, according to another example embodiment of the present invention. The source region 502 includes an n+ doped region 510 (e.g., a source) forming a p-n junction with p-doped silicon substrate 530. The gated region 504 includes a gate 544, separated from a low-bandgap Germanium region 520 by n+ doped polysilicon 540 and a dielectric layer 542, which also extends over the n+ doped region 510 of the source region 502. A counter-doped (p-doped) polysilicon region 512 bridges the source region 502 and the gated region 504 together so that current can flow from the source to the gate through the polysilicon bridge.

FIG. 6 shows a two-terminal NDR arrangement 600 with a thin-film-transistor (TFT) 606 combined with a gated diode region 604, according to another example embodiment of the present invention. The TFT 606 includes an n+ region 618, a p-doped channel region 616 and a portion of an n+ polysilicon region 640, the latter of which forms a portion of the gated diode region 604. A dielectric material 614 separates a gate 612 (PG) of the TFT from the p-doped channel region 616.

The gated diode region 604 includes a gate contact 644 and n+ polysilicon 640 separated from a low-bandgap material 620, again represented by Germanium by way of example, by a gate dielectric 642.

The TFT 606 is arranged over (or as part of) a source region 602, which includes an n+ doped region 610 that forms a p-n junction with p-doped silicon 630. The polysilicon TFT 606 serves to control the potential of the source region 602, and facilitates the flow of source current out of the gate so that Ig-Vg (current-voltage for the gate) exhibits NDR characteristics. Similar to the transistor-buffered diode in FIG. 1, the gate bias of the poly TFT ($V_{PG}$) provides a handle to control the NDR behavior of the device 600.

In addition to its applicability to many memory applications, the present invention is applicable to such circuits a 1T (one-transistor) logical "OR" gate, multi-valued and self-latching logic circuits, pulse generation, analog-to-digital conversion, shift registers, oscillator elements, frequency multiplication, low noise amplification, neural networks, and fuzzy logic.

While the present invention has been described with reference to several particular example embodiments, those skilled in the art will recognize that many changes may be made thereto without departing from the spirit and scope of the present invention. Such changes may include, for example, implementing a variety of control devices for the source of an NDR arrangement as described, in addition to those shown, using different low-bandgap materials, and bridging the source and gate in different manners. These and other approaches as described in the claims below characterize aspects of the present invention.

What is claimed is:

1. An NDR device, comprising:
    an electrical-gradient region, and
    a tunneling-gradient region, with respective regions for relatively-high tunneling efficiency and relatively-low tunneling efficiency, to facilitate conduction through the electrical-gradient region and the relatively-high tunneling efficiency region in an initial peak current stage and, in a valley current stage, to mitigate conduction through the relatively-high tunneling efficiency region.

2. The device of claim 1, further comprising a gate capacitively coupled to the tunneling-gradient region to control the NDR device for selectively passing current predominantly via one of the respective regions for relatively-high tunneling efficiency and relatively-low tunneling efficiency, and wherein the electrical-gradient region delineates a source region adjacent to the tunneling-gradient region.

3. The device of claim 1, wherein the region of relatively-high tunneling efficiency and the region of relatively-low tunneling efficiency are respectively adapted to facilitate relatively high tunneling current and relatively low bulk generation current.

4. The device of claim 1, wherein the region of relatively-high tunneling efficiency and the region of relatively-low tunneling efficiency are arranged to facilitate a peak-to-valley current ratio for the NDR device that is at least about 300.

5. The device of claim 1, wherein the NDR device is coupled in parallel with a capacitive device and facilitates an initial relatively high current flow through the NDR device.

6. The NDR device of claim 1, wherein the tunneling-gradient region for relatively-high tunneling efficiency exhibits a lower bandgap, relative to material in the tunneling-gradient region for relatively-low tunneling efficiency.

7. An NDR device, comprising:
    a tunneling-gradient region having respective regions for relatively-high tunneling efficiency and relatively-low tunneling efficiency;
    a source region adjacent to the tunneling-gradient region and arranged to pass current via the tunneling-gradient region; and
    a control node to facilitate conduction between the source region and the relatively-high tunneling efficiency region in an initial peak stage and, in a valley stage, to mitigate conduction through the relatively-high tunneling efficiency region.

8. The NDR device of claim 7, wherein the control node includes a gate capacitively coupled to the tunneling-gradient region to control the accumulation of carriers in the tunneling-gradient region for switching the NDR device between a relatively high current condition and a relatively low current condition by controlling the tunneling-gradient region to respectively pass current predominantly through the relatively high tunneling efficiency region and predominantly through the relatively low tunneling efficiency region.

9. The NDR device of claim 7, wherein the source region and the control node are coupled to a common electrical node and responsive to current applied to the common node by respectively providing current flow in the NDR device and controlling current flow in the tunneling-gradient region.

10. The NDR device of claim 7, wherein the NDR device has terminals for coupling in a circuit, the terminals consisting of a source terminal and a common-reference terminal, the source terminal coupled to the source region and to the control node.

11. The NDR device of claim 7, wherein the NDR device has terminals for coupling in a circuit, the terminals including a source terminal and a ground terminal, the source terminal coupled to the source region and to the control node, wherein the NDR device is responsive to a current applied to the source region by
    initially operating in a high current condition in response to capacitive coupling of the control node to facilitate an accumulation of carriers in the tunneling-gradient region for relatively-high tunneling efficiency, the current being predominantly tunneling current passing between the source region and the tunneling-gradient region for relatively-high tunneling efficiency; and
    operating in a low current condition in response to capacitive coupling of the control node to facilitate an inversion of carriers in the tunneling-gradient region for relatively-high tunneling efficiency, the current being predominantly bulk generation current passing between the source region and the tunneling-gradient region for relatively-low tunneling efficiency.

12. A memory device for coupling data to a circuit node and susceptible to current leakage, the memory device comprising:
    a capacitive data-storage circuit;
    an access circuit to provide access between the capacitive data-storage circuit and the circuit node; and
    at least one NDR device connected with the capacitive data-storage circuit, the at least one NDR device including
        an electrical-gradient region, and
        a tunneling-gradient region with respective regions for relatively-high tunneling efficiency and relatively-low tunneling efficiency, to facilitate conduction through the electrical-gradient region and the relatively-high tunneling efficiency region in an initial stage and, in another stage, to mitigate conduction through the electrical-gradient region to provide current to compensate for current leakage of the memory device.

13. The memory device of claim 12, wherein the NDR device includes a gate to capacitively couple to the tunneling-gradient region to selectively control the passage of current through the respective regions for relatively-high tunneling efficiency and relatively-low tunneling efficiency.

14. The memory device of claim 12, wherein the electrical-gradient region delineates a source region that is adjacent to the tunneling-gradient region.

15. The memory device of claim 14, wherein the NDR device further includes
   a gate to capacitively couple to the tunneling-gradient region to selectively control the passage of current through the respective regions for relatively-high tunneling efficiency and relatively-low tunneling efficiency, and
   a transistor including the source region and having a drain region coupled to the gate and responsive to a voltage by selectively coupling current from the drain to the source.

16. The memory device of claim 12, further including
   a gate to capacitively couple to the tunneling-gradient region to control the passage of current through the respective regions for relatively-high tunneling efficiency,
   a source region, including a source, that is adjacent to the tunneling-gradient region and electrically coupled to the gate, the source region and the gate connected to the capacitive data-storage circuit and to the access circuit,
   wherein the NDR device operates in an initial peak current condition in response to voltage applied to the gate by controlling, via the gate, the passage of current from the source region through the relatively-high tunneling efficiency tunneling-gradient region, and
   wherein, after the initial peak current condition, the NDR device operates in a valley current condition in response to voltage applied to the gate by controlling, via the gate, the passage of current from the source region through the relatively-low tunneling efficiency tunneling-gradient region, thereby compensating for current leakage in the memory device.

17. The memory device of claim 16, wherein the source region is indirectly coupled to the gate to facilitate the inversion of the tunneling-gradient region.

18. The memory device of claim 16, wherein the source region is indirectly coupled to the gate to control the rise of the potential of the source region, relative to a rise in potential of the gate, to facilitate the inversion of the tunneling-gradient region.

19. The memory device of claim 16, wherein the source region is indirectly coupled to the gate to slow the rise in potential of the source region, relative to a rise in potential of the gate region, using one of: a transistor, a resistor, a dielectric spacer, a polysilicon bridge and a thin-film transistor.

20. The memory device of claim 12, wherein the at least one NDR device includes two such NDR devices, wherein
   a first one of the two NDR devices in parallel with the capacitive data-storage circuit and adapted, for a memory bit "0" condition, to pass relatively high current via the electrical-gradient region in an initial peak current stage during a write "0" operation, and to pass relatively low current via the electrical-gradient region in a valley current stage during a store "0" condition to provide current to mitigate the loss of the stored "0" value; and
   a second one of the two NDR devices in series with the capacitive data-storage circuit and adapted, for a memory bit "1" condition, to pass relatively high current via the electrical-gradient region in an initial peak current stage during a write "1" operation, and to pass relatively low current via the electrical-gradient region in a valley current stage during a store "1" condition to provide current to mitigate the loss of the stored "1" value.

21. A negative differential resistance arrangement comprising:
   a current-passing region including an upper layer to pass predominantly tunneling current and a lower layer to mitigate tunneling current;
   a gate capacitively coupled to the current-passing region to selectively facilitate the passage of current via the upper layer or the lower layer;
   a source electrically connected to the gate and arranged adjacent to the upper and lower layers; and
   wherein the gate and the source are arranged to respond to the application of current thereto by, via the capacitive coupling of the gate to the current-passing region, initially passing peak current between the source and the upper layer using a high electrical field in the upper layer, and subsequently passing valley current to pass between the source and the lower region by depleting the upper layer.

* * * * *